United States Patent [19]
Kadomaru et al.

[11] Patent Number: 5,596,294
[45] Date of Patent: Jan. 21, 1997

[54] SYNCHRONIZING CIRCUIT FOR DIVIDING A FREQUENCY OF A CLOCK SIGNAL SUPPLIED FROM AN EXTERNAL DEVICE INTO A PLURALITY OF INTERNAL CLOCK SIGNALS

[75] Inventors: Noriko Kadomaru; Fumitaka Asami, both of Kawasaki, Japan

[73] Assignee: Fujitsu Limited, Kawasaki, Japan

[21] Appl. No.: 492,311

[22] Filed: Jun. 19, 1995

[30] Foreign Application Priority Data

Sep. 20, 1994 [JP] Japan .................................. 6-224677

[51] Int. Cl.⁶ ............................................... H03K 1/04
[52] U.S. Cl. .......................... 327/145; 327/151; 327/295
[58] Field of Search .................... 327/145, 151, 327/295

[56] References Cited

U.S. PATENT DOCUMENTS 3,740,660  6/1973  Davies, Jr. ............................. 327/295
3,896,388  7/1975  Hatsukano et al. ................... 327/295
4,463,440  7/1984  Nishiura et al. ...................... 327/295

FOREIGN PATENT DOCUMENTS 363142715  6/1988  Japan .................................... 327/145

Primary Examiner—Margaret Rose Wambach
Attorney, Agent, or Firm—Armstrong, Westerman, Hattori, McLeland & Naughton

[57] ABSTRACT

A synchronizing circuit has a first signal generating unit for dividing a control signal to obtain a first signal having a first frequency, a second signal generating unit for dividing the control signal to obtain a second signal having a second frequency, a third signal generating unit for dividing the control signal to obtain a third signal having a third frequency and synchronized with the second signal, and a synchronizing signal generating unit for generating a synchronizing signal which is adapted to synchronize the first signal with the second and third signals in accordance with a logical operation on the first, second and third signals. With this arrangement, the internal clock signals can be synchronized without using a reset signal. Consequently, neither wiring for supplying the reset signal nor a circuit for generating the reset signal are necessary.

18 Claims, 19 Drawing Sheets

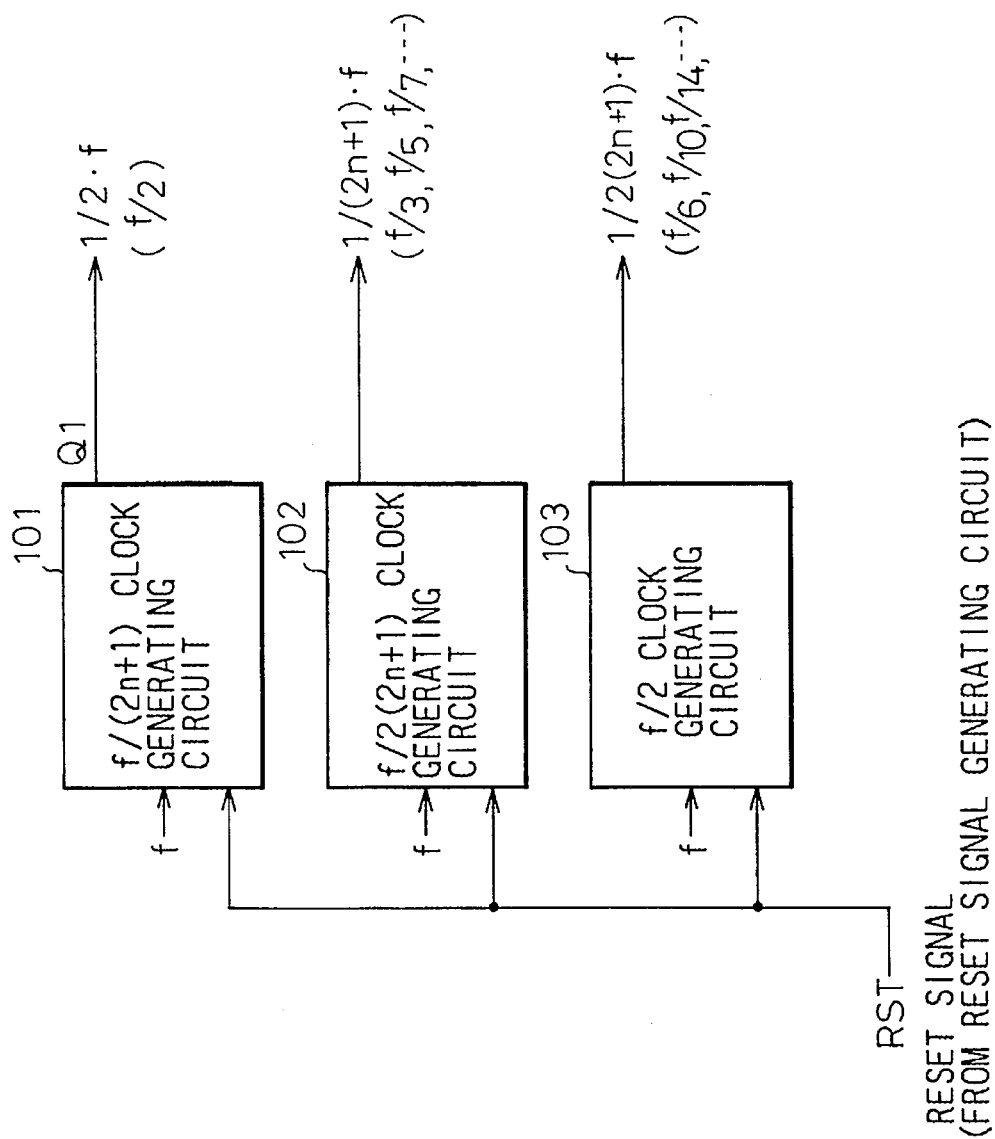

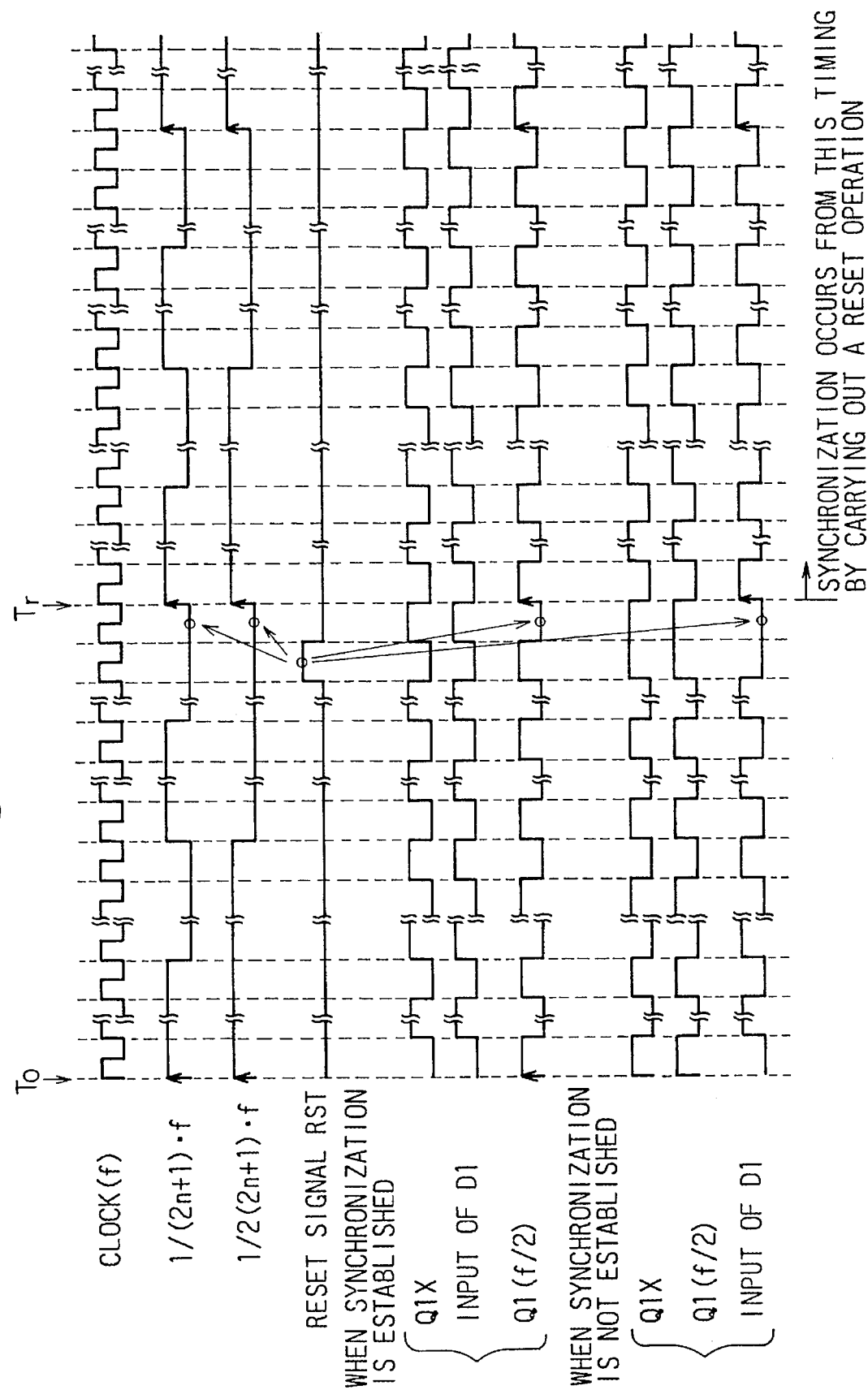

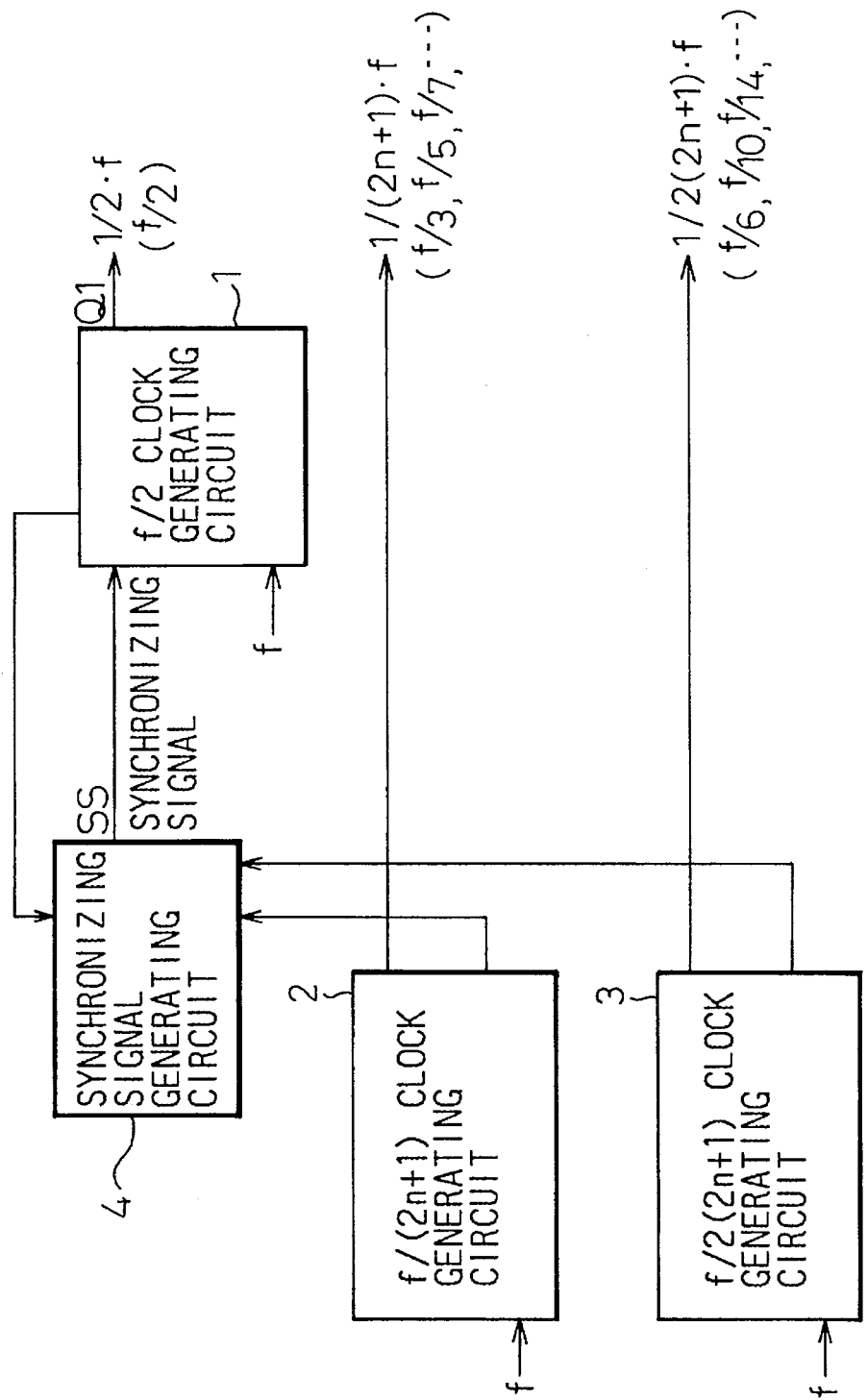

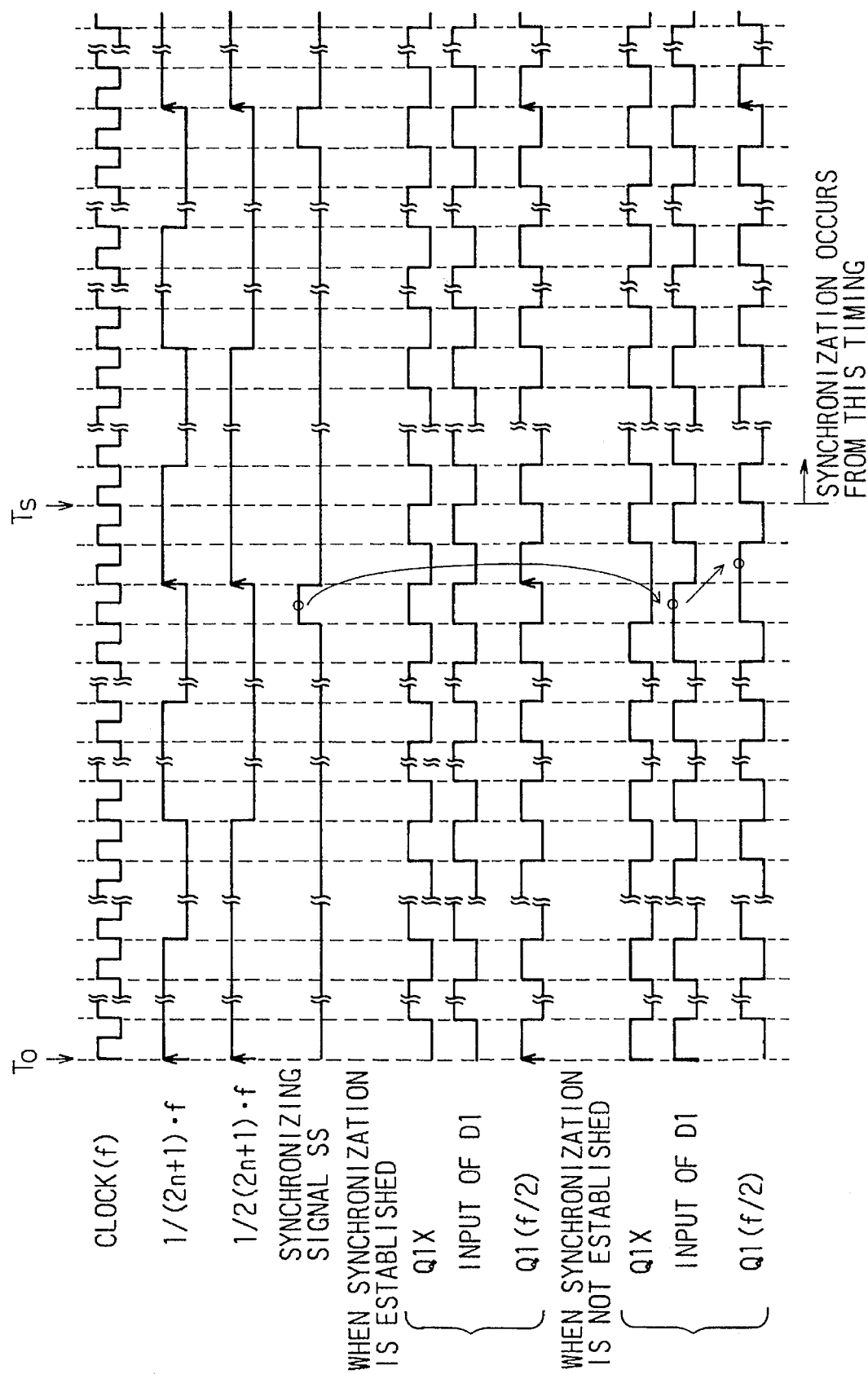

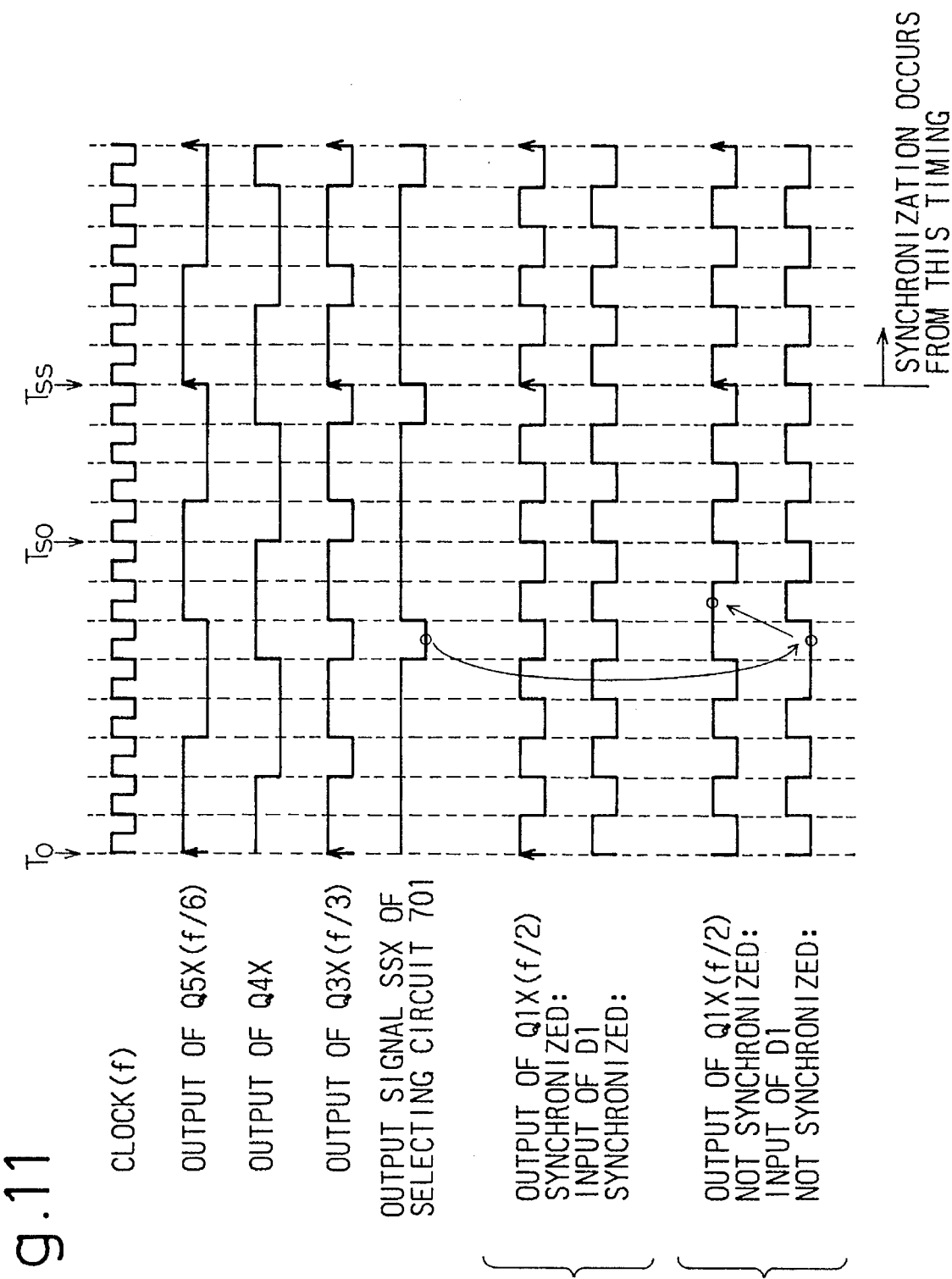

SYNCHRONIZING CIRCUIT FOR DIVIDING A FREQUENCY OF A CLOCK SIGNAL SUPPLIED FROM AN EXTERNAL DEVICE INTO A PLURALITY OF INTERNAL CLOCK SIGNALS

BACKGROUND OF THE INVENTION

1. Field of the Invention

The present invention relates to a synchronizing circuit, and more particularly, to a synchronizing circuit in which a clock signal supplied from an external device is divided into a plurality of internal clock signals having different periods, so that the internal clock signals can be synchronously output.

2. Description of the Related Art

In a recent image processing technology, e.g., a MUSE (multiple sub-Nyquist sample encoding) decoder in a HDTV (high definition television), etc., it is necessary to incorporate a synchronizing circuit which is adapted to divide the frequency of a clock signal supplied from an external device into a plurality of internal clock signals having different periods and output the same.

In a conventional circuit (apparatus) in which plurality of clock signals (internal clock signals) whose frequencies (periods) are different from each other are necessary, if the internal clock signals have frequencies that are even times one another, the internal clock signals can be easily synchronized, but if the frequencies are in a relation of odd-number multiple of one another, it is difficult to synchronize the internal clock signals. To solve this, it is known in a synchronizing circuit to use a reset signal in order to synchronize the internal clock signals, regardless of the relationship of the frequency therebetween.

Namely, the conventional synchronizing circuit is, for example, constructed such that the internal clock signals are synchronized upon resetting using a reset signal. However, to synchronize the internal clock signals using the reset signal, a reset terminal must be provided as an external input signal terminal of the circuit or system. Further, it is also necessary to provide wiring for supplying the reset signals. The wiring for the reset signals includes not only a wiring within the semiconductor integrated circuit (IC), but also a wiring provided on a circuit board for the IC.

Therefore, it is necessary to additionally provide a reset terminal and wiring for the reset signals in a known synchronizing circuit. Further, in the conventional synchronizing circuit, reset signal generating circuit is necessary for generating the reset signal. The problems of the related art will be explained hereinafter in detail with reference to the accompanying drawings.

SUMMARY OF THE INVENTION

An object of the present invention is to provide a synchronizing circuit in which internal clock signals can be synchronized without using a reset signal. Another object of the present invention is to provide a synchronizing circuit in which no reset signal generating circuit is necessary to generate a reset signal.

According to the present invention, there is provided a synchronizing circuit comprising a first signal generating unit for dividing a control signal to obtain a first signal having a first frequency; a second signal generating unit for dividing the control signal to obtain a second signal having a second frequency; a third signal generating unit for dividing the control signal to obtain a third signal having a third frequency and synchronized with the second signal; and a synchronizing signal generating unit for generating a synchronizing signal which is adapted to synchronize the first signal with the second and third signals in accordance with a logical result of the first, second and third signals.

The control signal may be an externally supplied clock signal and wherein the first, second and third signals may be internal clock signals having different frequencies. The first signal generating unit may generate the first signal whose frequency is one-half the frequency of the control signal; the second signal generating unit may generate the second signal whose frequency is one-third the frequency of the control signal; and the third signal generating unit may generate the third signal whose frequency is one sixth the frequency of the control signal, respectively. The third signal generating circuit may divide the second signal generated by the second signal generating unit by two to obtain the third signal whose frequency is one-half the frequency of the second signal.

The first, second and third signal generating units may comprise D-type flip-flops. The first signal generating unit may comprise a first-D-type flip-flop which receives and divides the control signal by two; the second signal generating unit may comprise second and third D-type flip-flops which receive and divide the control signal by three; and the third signal generating unit may comprise a fourth D-type flip-flop which divides the output of the second signal generating unit. The first signal generating unit may comprise a first D-type flip-flop which receives and divides the control signal by two; the second signal generating unit may comprise second and third D-type flip-flops which receive and divide the control signal by three; and the third signal generating unit may comprise a fourth D-type flip-flop which divides the control signal by three in response to an output of the second D-type flip-flop and a fifth D-type flip-flop which divides an output of the fourth D-type flip-flop in response to the control signal.

The synchronizing signal generating unit may generate the synchronizing signal in accordance with a logical result of an output of the second signal generating unit and an output of the third signal generating unit. The synchronizing signal generating unit may comprise an AND gate, so that the synchronizing signal may be obtained by a logical result of the output of the second signal generating unit and the output of the third signal generating unit. The first signal generating unit may generate the first signal in accordance with a logical result of the synchronizing signal generated by the synchronizing signal generating unit and an output of the first signal generating unit.

The synchronizing signal generating unit may comprise a first selecting circuit. The first selecting circuit may select the output of the second signal generating unit or an output of a first power source unit to generate the synchronizing signal in accordance with the output of the third signal generating unit. The synchronizing signal as the output of the first selecting circuit may be supplied to a second selecting circuit, so that the first signal generating unit may generate the first signal in accordance with the output of the first signal generating unit or the output of a second power source, selected by the second selecting circuit, in accordance with the synchronizing signal. The first and second selecting circuits may comprise inverters and transfer gates.

The first, second and third signals may be synchronized at the rise of a wave-shape pulse. The synchronizing circuit may be applied to a clock distributor of a decoder in a high definition television system. The synchronizing circuit may be applied to a clock distributor of a multiple sub-Nyquist sample encoding decoder.

In addition, according to the present invention, there is also provided a synchronizing circuit comprising a first signal generating circuit for dividing a control signal to obtain a first signal having a first frequency; a second signal generating circuit for dividing the control signal to obtain a second signal having a second frequency; a third signal generating circuit for dividing the control signal to obtain a third signal having a third frequency and synchronized with the second signal; and a synchronizing signal generating circuit for generating a synchronizing signal which is adapted to synchronize the first signal with the second and third signals in accordance with a logical result of the first, second and third signals.

BRIEF DESCRIPTION OF THE DRAWINGS

The invention will be more clearly understood from the description of the preferred embodiments as set forth below with reference to the accompanying drawings, wherein;

FIG. 1 is a block diagram of a known synchronizing circuit by way of example;

FIG. 2 is a timing chart of operations of the synchronizing circuit shown in FIG. 1;

FIG. 4 is a block diagram of a synchronizing circuit according to the present invention;

FIG. 5 is a timing chart of operations of the synchronizing circuit shown in FIG. 4;

FIG. 11 is a timing chart of operations of the synchronizing circuit shown in FIG. 10;

DESCRIPTION OF THE PREFERRED EMBODIMENTS

Figure 3A:
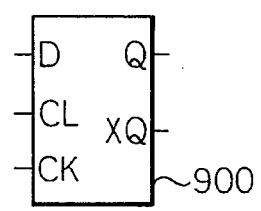
FIG. 3A is a drawing showing a flip-flop used in the synchronizing circuit shown in FIG. 1.

Prior to describing the preferred embodiments of the present invention, the drawbacks of a known synchronizing circuit (prior art) will be discussed.

FIG. 1 shows a circuit diagram of a known synchronizing circuit, in which a reset signal is used; and FIG. 2 shows a timing chart of the operations of a synchronizing circuit shown in FIG. 1, respectively.

In FIG. 1, numeral 101 designates a $½f$ [$=f/2$] clock signal generating circuit; 102 a $1/(2n+1)f$ [$=f/(2n+1)$] clock signal generating circuit; and 103 a $½(2n+1)f[=f/2(2n+1)]$ clock signal generating circuit, respectively. The symbol "f" represents the frequency of the clock pulse (clock signal); "RST" the reset signal; and "n" the natural numbers, respectively. Note that the reset signal RST is used to reset the clock generating circuits 101, 102 and 103 that are formed, for example, by counters, to zero.

As can be seen in FIG. 1, in a conventional synchronizing circuit, the clock signals f and the reset signals RST are supplied to the $½f$ clock generating circuit 101, the $1/(2n+1)f$ clock generating circuit 102, and the $½(2n+1)f$ clock generating circuit 103, so that the clock signals f are divided to obtain three internal clock signals having different periods, that are synchronously output. Namely, the $½f$ clock generating circuit 101 produces signals of $½f$, the $1/(2n+1)f$ clock generating circuit 102 produces signals of $1/(2n+1)f$ (i.e., $f/3, f/5, f/7, \ldots$), and the $½(2n+1)f$ clock generating circuit 103 produces signals of $½(2n+1)$ (i.e., $f/6, f/10, f/14, \ldots$), respectively. The reset signals RST are generated for example by an external reset signal generating circuit (not shown) and supplied to the synchronizing circuit.

As may be seen in FIG. 2, if the $½f$ clock signal, the $1/(2n+1)$ clock signal and the $½(2n+1)$ clock signal are synchronous with each other at time T0, (namely, the rise time of each pulse is identical), or the $½f$ clock signal, the $1/(2n+1)f$ clock signal and the $½(2n+1)f$ clock signal are not synchronized with each other (namely, the rise time of each pulse is not identical), the rise times of the pulses are synchronized at time Tr at which the reset signal RST (high level "H") is input, immediately after the time T0.

Figure 3B:
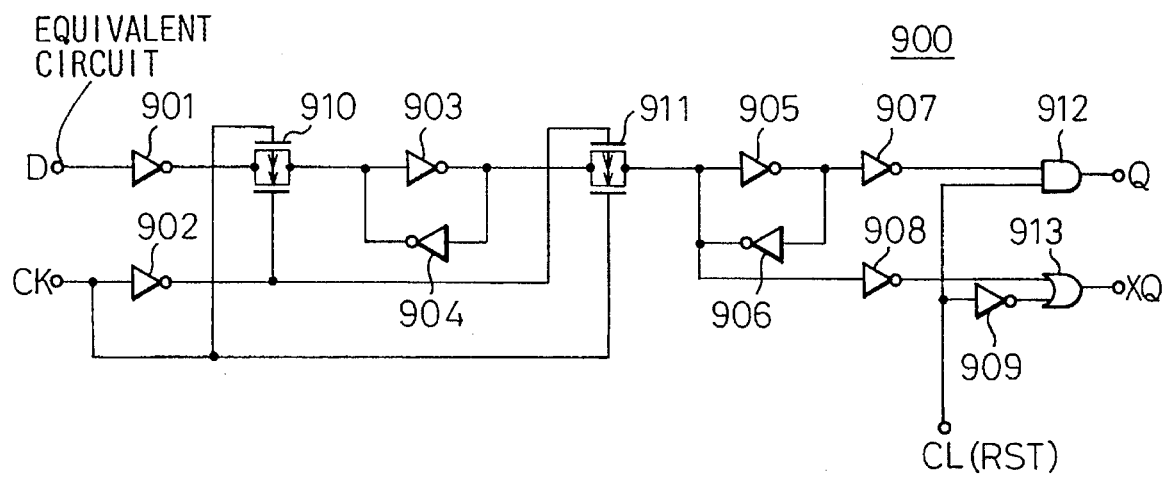
FIG. 3B is an equivalent circuit diagram of the flip-flop shown in FIG. 3A.

FIGS. 3A and 3B show an example of a flip-flop used in the synchronizing circuit shown in FIG. 1. FIG. 3A shows a D-type flip-flop with a clear terminal (reset terminal) and FIG. 3B shows an equivalent circuit diagram to the flip-flop shown in FIG. 3A.

In FIG. 3B, the flip-flop used in the clock generating circuit 101, 102 or 103 comprises a plurality of inverters 901 through 909, transfer gates 910, 911, and an AND gate 912, and a NOR 913. The reset signal RST (clear signal CL) is supplied to one of the input terminals of the AND gate 912 and to one of the input terminals of the NOR gate 913 through the inverter 909, respectively, so that when the reset signal RST is at low level "L", the output Q becomes low level "L", and the inverted output XQ becomes high level "H" to thereby carry out the resetting.

As can be understood from the foregoing, the conventional synchronizing circuit is constructed such that the internal clock signals are synchronized upon resetting using a reset signal. However, to synchronize the internal clock signals using the reset signal, the reset terminal must be inevitably provided as an external input signal terminal of the circuit or system. Moreover, it is also necessary to provide a wiring for supplying the reset signals. The wiring for the reset signals includes not only wiring within the semiconductor integrated circuit (IC) but also wiring provided on a circuit board for the IC.

Namely, it is necessary to additionally provide the reset terminal and the wiring for the reset signals in a known synchronizing circuit as shown in FIGS. 1 and 2. Furthermore, in the conventional synchronizing circuit, the reset signal generating circuit is necessary for generating the reset signal RST.

The principle of a synchronizing circuit according to the present invention will be discussed below with reference to FIGS. 4 and 5.

In FIG. 4, which shows a block diagram of a synchronizing circuit, numerals 1 designates the ½f [=f/2] clock generating circuit, 2 the 1/(2n+1)f [=f/(2n+1)] clock generating circuit, 3 the ½(2n+1)f [=f/(2n+1)] clock generating circuit, and 4 the synchronizing signal generating circuit, respectively. Symbol "f" represents the frequency of the clock pulse (clock signal) or clock signal itself; "SS" the synchronizing signal; and "n" the natural numbers (1, 2, . . . ), respectively. Namely, the ½f clock generating circuit 1 produces signals of ½f, the 1/(2n+1)f clock generating circuit 2 produces signals of 1/(2n+1)f (i.e., f/3, f/5, f/7, . . . ), and the ½(2n+1)f clock generating circuit 3 produces signals of ½(2n+1)f (i.e., f/6, f/10, f/14, . . . ), respectively. The ½f clock signal is produced, for example, by dividing a basic clock signal f (external clock signal) into two signals by the ½f clock generating circuit 1.

As shown in FIG. 4, the clock signals f are fed to the ½f clock generating circuit 1, the 1/(2n+1)f clock generating circuit 2, and the ½(2n+1)f clock generating circuit 3. The signals from the clock generating circuits 1, 2 and 3 are supplied to the synchronizing circuit 4, and the output signal SS (synchronizing signal) of the synchronizing circuit 4 is supplied to the ½f clock generating circuit 1 to synchronize the output signals (internal clock signals) of the clock generating circuits 1, 2 and 3.

FIG. 5 shows a timing chart of the operations of the synchronizing circuit shown in FIG. 4. In FIG. 5, "D1" denotes a data input signal of a flip-flop (e.g., flip-flop 31 in FIG. 6) to produce the ½f clock signal; and "Q1" and "Q1X" the output signal and the inverted output signal of the flip-flop, respectively.

As can be seen in FIG. 5, if the ½f clock signal, the 1/(2n+1)f clock signal, and the ½(2n+1)f signal are synchronized at time T0 (i.e., if the rise time of each pulse is identical), the synchronization is maintained.

Conversely, if the ½f clock signal, the 1/(2n+1)f clock signal, and the ½(2n+1)f signal are not synchronized (i.e., if the rise time of each pulse is not identical), the synchronizing signal SS (level "H") to be input to the ½f clock generating circuit 1 is output, so that the rising times of the signals (pulses) are synchronized at time Tr.

The preferred embodiments of the present invention will be discussed below.

Figure 6:
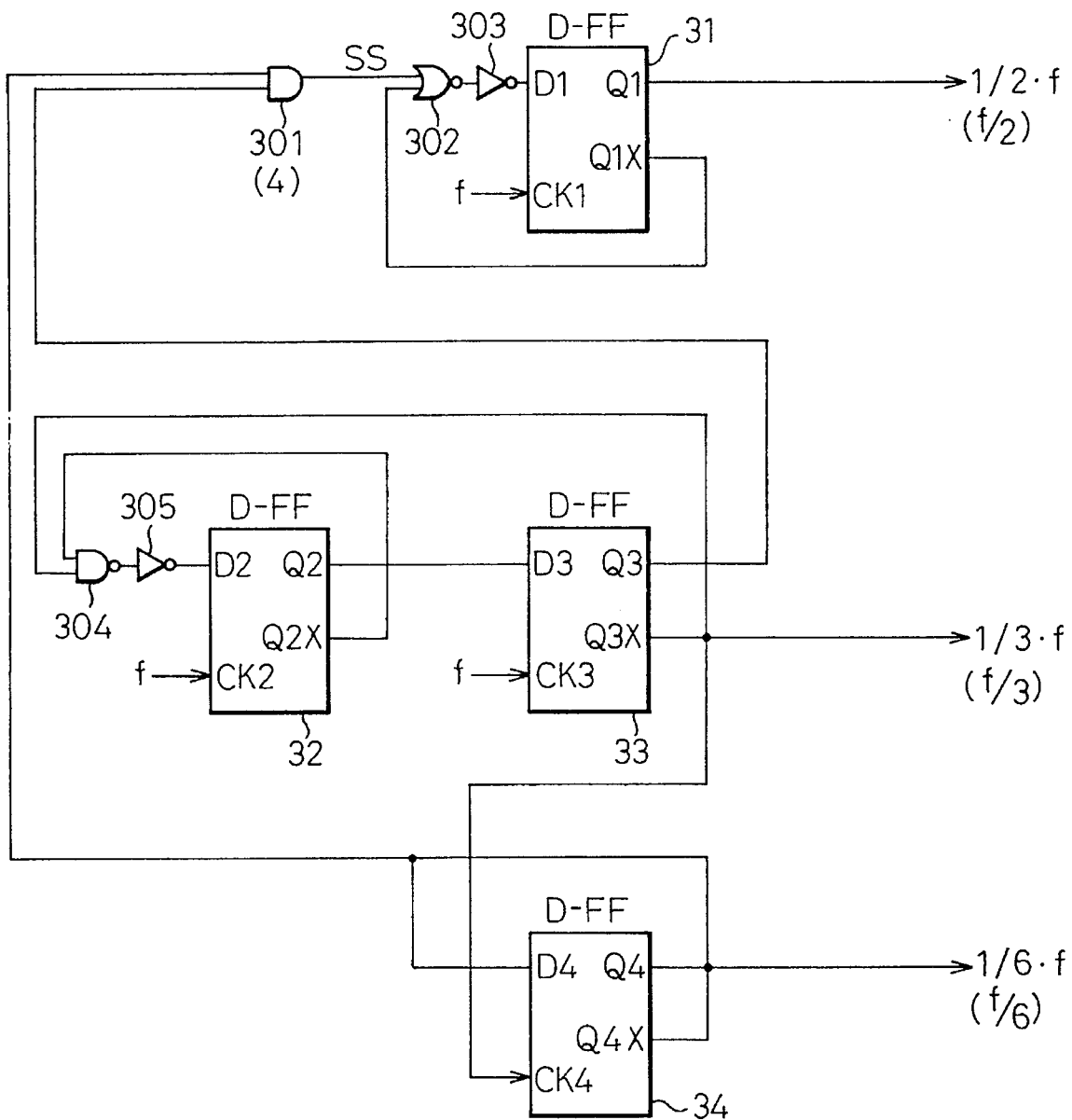
FIG. 6 is a circuit diagram of a synchronizing circuit according to a first embodiment of the present invention.
Figure 7:
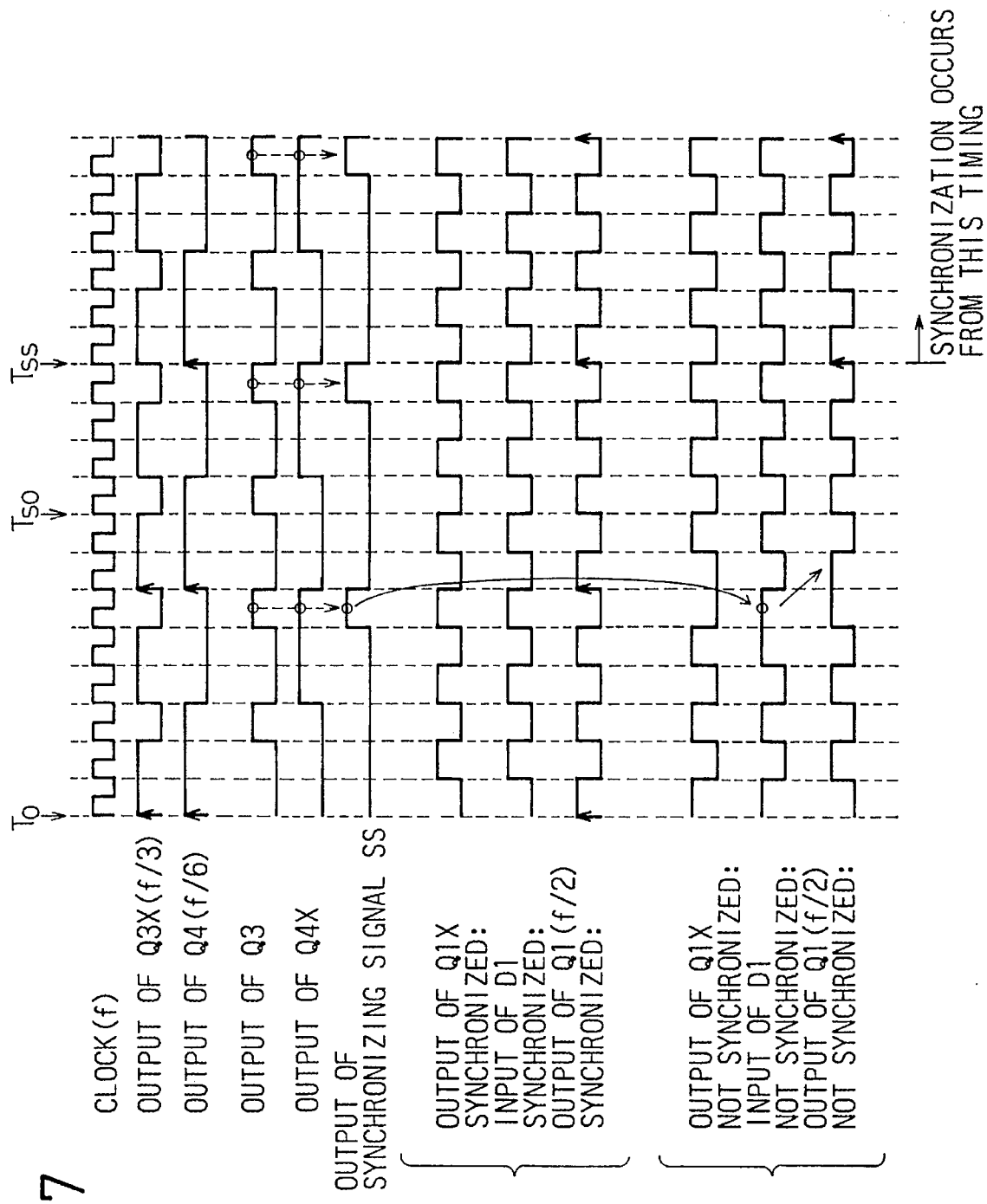
FIG. 7 is a timing chart of operations of the synchronizing circuit shown in FIG. 6.

FIGS. 6 and 7 show a first embodiment of the present invention, in which n=1. At n=1, the 1/(2n+1)f clock generating circuit 2 produces f/3 clock signals (internal clock signals) and the ½(2n+1)f clock generating circuit 3 produces f/6 clock signals, respectively.

As shown in FIG. 6, the synchronizing circuit according to the first embodiment of the invention comprises four D-type flip-flops (D-FF) 31 through 34, an AND gate 301, a NOR gate 302, inverters 303 and 305, and a NAND gate 304. The f/6 clock signal is obtained by dividing the f/3 clock by 2. The duty ratio of the f/3 clock signal is for example, 2:1 (see FIG. 7). Note that if the duty ratio of the f/3 clock signal is 2:1, there is no problem so long as the rise times of the wave-shape signals are synchronized.

The synchronizing signal generating circuit 4 comprises an AND gate 301 having an input terminal to which the output Q3 of the flip-flop 33, which outputs f/3 clock signals, and the inverted output Q4X of the flip-flop 34, which outputs f/6 clock signals, are supplied. The output of the AND gate 301 is supplied to the input terminal of the NOR gate 302, together with the inverted output Q1X of the flip-flop 31 which produces f/2 clock signals. The output of the NOR gate 302 is supplied to the data input terminal D1 of the flip-flop 31 through the inverter 303.

The f/2 internal clock signal, which is obtained by dividing the clock signal f by 2, is taken out from the output (output terminal) Q1 of the flip-flop 31 and the f/3 internal clock signal, which is obtained by dividing clock signal f by 3, is taken out from the inverted output Q3X (inverted output terminal) of the flip-flop 33. Similarly, the f/6 internal clock signal, which is obtained by dividing the clock signal f by 6, is taken out from the output Q4 of the flip-flop 34. The clock signal f (external clock signal having the frequency f) is supplied to the clock terminals CK1 through CK3 of the flip-flops 31 through 33. The inverted output Q3X of the flip-flop 33 is supplied to the clock terminal CK4 of the flip-flop 34.

As shown in FIG. 7, if the f/2 clock signal, the f/3 clock signal, and the f/6 clock signal are synchronized at time T0 (i.e., if the rising time of each pulse is identical), the synchronization is maintained, regardless of the output level (level "H") of the synchronizing signal SS. It should be appreciated that since the f/6 clock signal is produced by dividing the f/3 clock signal by 2, they are always synchronized.

If the f/2 clock signal is not synchronized with the f/3 clock signal or f/6 clock signal at time T0 (i.e., if the rising time of each pulse is not identical), the period of level "H" at the data input terminal D1 of the flip-flop 31 is extended by the synchronizing signal whose level is "H", as shown in FIG. 7. Namely, the period of "H" is extended by one cycle of the clock signal f. Consequently, the output Q1 (f/2 clock signal) of the flip-flop 31, the inverted output Q3X of the flip-flop 33 (f/3 clock signal) and the output Q4 of the flip-flop 34 (f/6 clock signal) are synchronized at time Tso. Note that the synchronization of the rise times of the clock signals (f/2. f/3 and f/6) actually occurs past time Tss, in view of the difference in the period between the clock signals.

Figure 8:
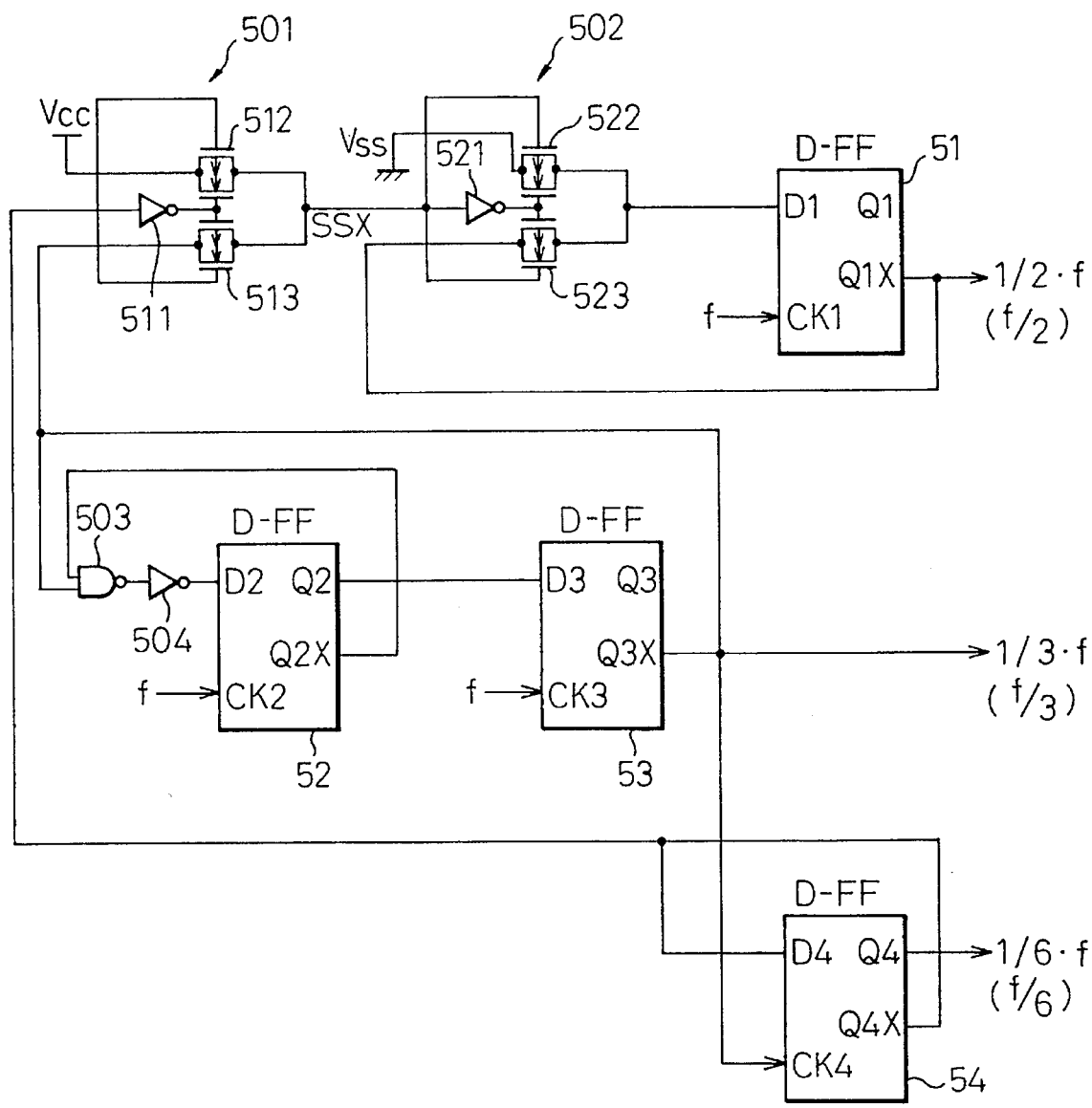
FIG. 8 is a circuit diagram of a synchronizing circuit according to a second embodiment of the present invention.
Figure 9:
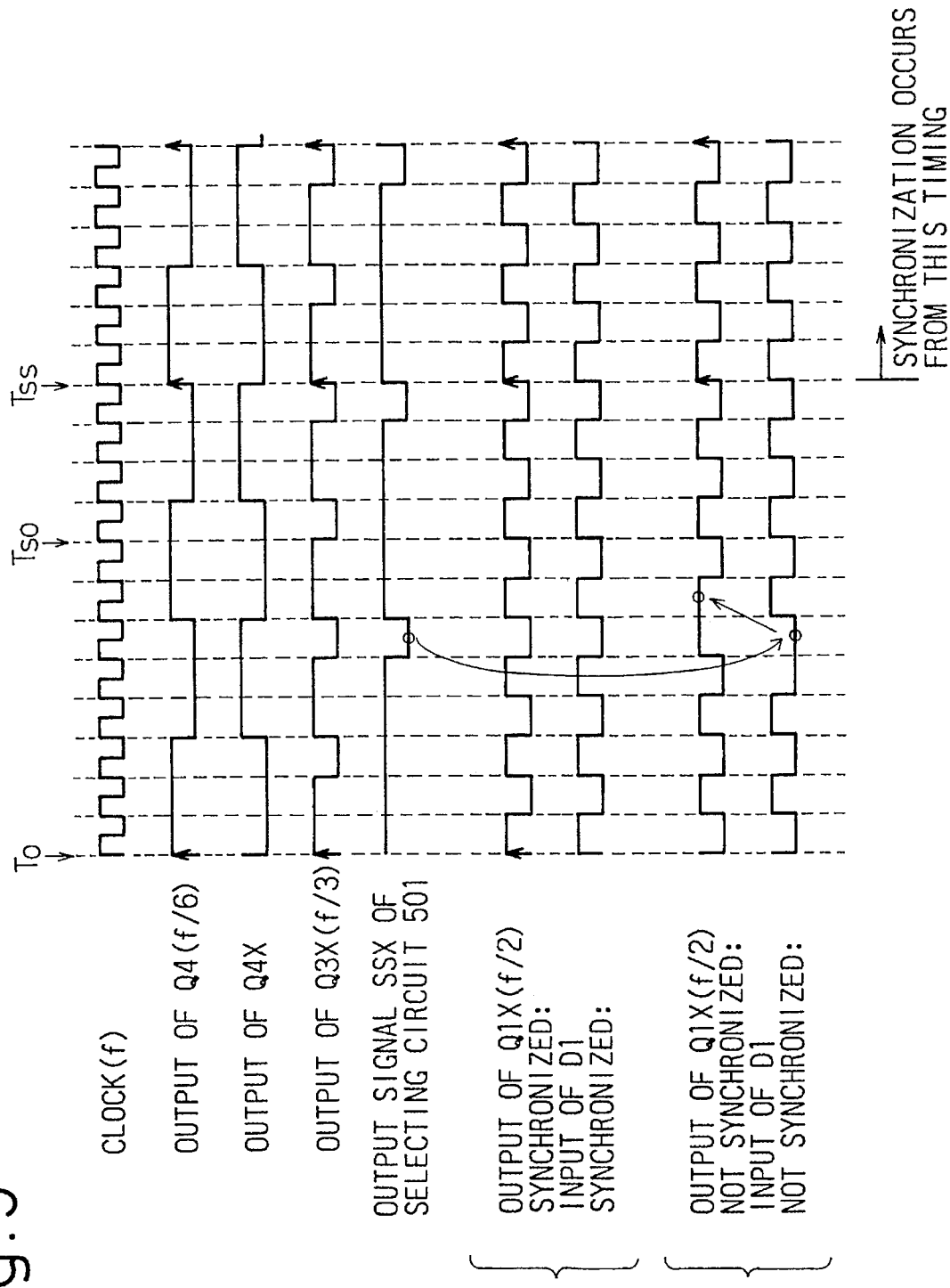
FIG. 9 is a timing chart of operations of the synchronizing circuit shown in FIG. 8.

FIGS. 8 and 9 show a second embodiment of a synchronizing circuit, according to the present invention, in which n=2.

As is apparent from FIG. 8, the synchronizing circuit of the second embodiment comprises four D-type flip-flop's (D-FF) 51 through 54, selecting circuits 501 and 502, a NAND gate 503, and an inverter 504.

The synchronizing signal generating circuit 4 comprises a first selecting circuit 501 which is provided with an inverter 511 and transfer gates 512 and 513. The first selecting circuit 501 selects a high power source level (level "H": Vcc) connected to the input terminal of the transfer gate 512 or an inverted output Q3X of the flip-flop 53 supplied to the input terminal of the transfer gate 513, in accordance with the inverted output Q4X of the flip-flop 54. The output (synchronizing signal SSX at an inverted level) of the first selecting circuit 501 is supplied to the data input terminal D1 of the flip-flop 51 through a second selecting circuit 502. The second selecting circuit 502 comprises transfer gates 522 and 523 and selects a low power source level (level "L": Vss) connected to the input terminal of the transfer gate 522 and an inverted output Q1X of the flip-flop 51 supplied to the input terminal of the transfer gate 523 in accordance with the output SSX of the first selecting circuit 501. The f/2 clock signal is fetched from the inverted output Q1X (inverted output terminal) of the flip-flop 51; the f/3 clock signal is fetched from the inverted output Q3X of the flip-flop 53; and, the f/6 clock signal is fetched from the output (output terminal) of the flip-flop 54, respectively.

As can be seen in FIG. 9, the operation of the synchronizing circuit according to the second embodiment is substantially the same as that of the first embodiment. Namely, if the f/2 clock signal is synchronized with the f/3 clock signal and the f/6 clock signal at time T0, the synchronization is maintained regardless of the output level (low level "L") of the inverted level of the synchronizing signal SSX.

Conversely, if the f/2 clock signal is not synchronized with the f/3 clock signal or f/6 clock signal at time T0, the period of low level of the data input terminal D1 of the flip-flop 51 is extended (by one cycle of the clock signal f) in accordance with the synchronizing signal SSX at low level "L", and hence the inverted output Q1X (f/2 clock signal) of the flip-flop 51 is synchronized with the inverted output Q3X (f/3 clock signal) of the flip-flop 53 and the output Q4 (f/6 clock signal) of the flip-flop 54. Note that the coincidence of the rise times of the clock signals (pulses) f/2, f/3 and f/6 occurs after time Tss due to the difference in period between the clock signals, similarly to the first embodiment illustrated in FIG. 7. The duty ratio of the f/3 clock signal is 2:1 by way of example.

Figure 10:
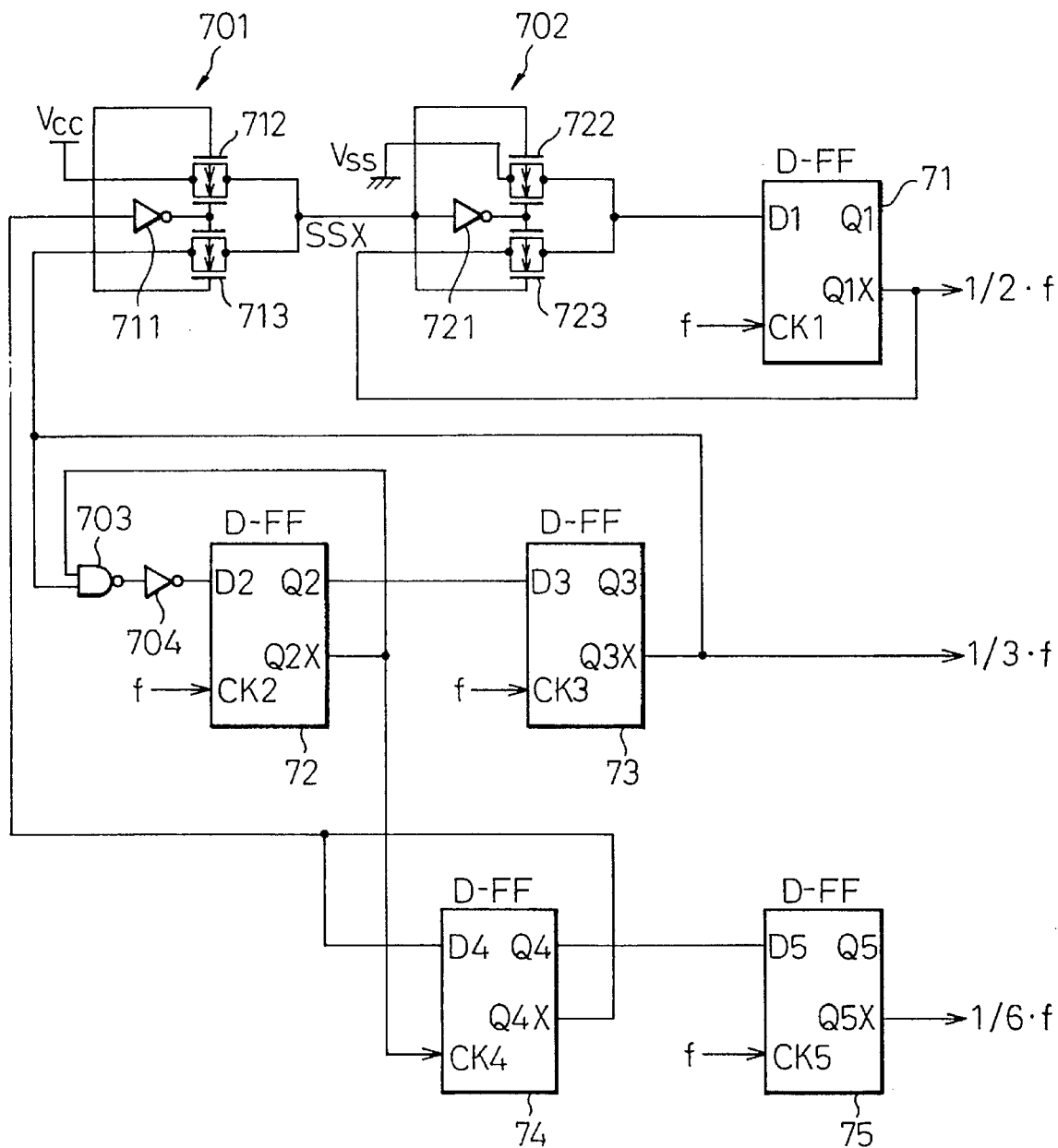
FIG. 10 is a circuit diagram of a synchronizing circuit according to a third embodiment of the present invention.

FIGS. 10 and 11 show a third embodiment of a synchronizing circuit of the invention in which n=1.

In the third embodiment illustrated in FIG. 10, the f/2 clock generating circuit (selecting circuits 701 and 702, flip-flop 71) and the f/3 clock generating circuit (NAND gate 703, inverter 704, flip-flops 72, 73) are the same as those in the second embodiment shown in FIG. 8. The f/6 clock generating circuit in the third embodiment is different from that in the first or second embodiment. In the third embodiment, a transmission gate is employed.

It should be recalled that in the first and second embodiments, illustrated in FIGS. 6 and 8, respectively, the f/6 clock signal is fetched as the output Q4 of the flip-flop 34 from the f/3 clock signal Q3X supplied to the clock terminal CK4. On the other hand, in the third embodiment illustrated in FIG. 10, the inverted output Q2X of the flip-flop 72 is supplied to the clock terminal CK4 of the D-type flip-flop 74, so that the output Q4 of the flip-flop 74 is supplied to the data terminal D5 of the D-type flip-flop 75 and the basic clock signal (external clock signal) f is supplied to the clock terminal CK5 of the flip-flop 75. Consequently, the f/6 clock signal is output in accordance with the basic clock signal so as to synchronize the f/6 clock signal with the f/3 clock signal and the f/2 clock signal.

Namely, the basic clock signals f are supplied to the clock terminals CK1, CK3, CK5 of the flip-flops 71, 73 and 75 which generate the f/2 clock signal, the f/3 clock signal and the f/6 clock signal, respectively, so that the synchronized internal clock signals are output in accordance with the clock signal f.

The operation of the third embodiment illustrated in FIG. 11 is basically the same as that of the second embodiment shown in FIG. 9. More precisely, in the third embodiment, the synchronization of the clock signals f/2, f/3 and f/6 can be established more exactly in accordance with the basic clock signal f.

Figure 12A:
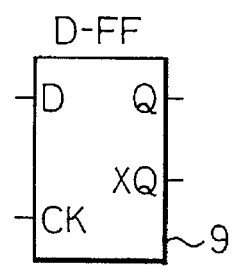
FIG. 12A is a conceptual view of a flip-flop used in embodiments of the present invention, by way of example.
Figure 12B:
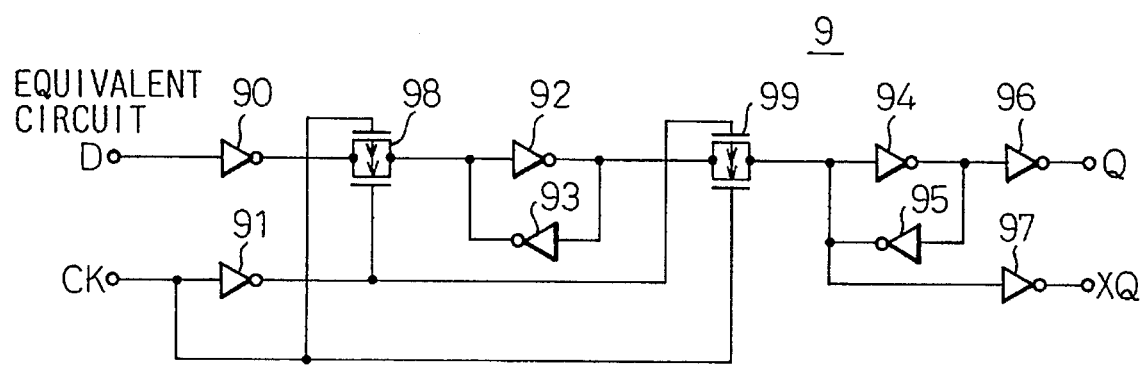
FIG. 12B is an equivalent circuit diagram of the flip-flop shown in FIG. 12A.

FIGS. 12A and 12B show an example of a flip-flop used in the above-mentioned embodiments illustrated in FIGS. 6, 8 and 10. FIG. 12 shows a D-type flip-flop and FIG. 13 shows an equivalent circuit diagram for the flip-flop.

The D-type flip-flop comprises a plurality of inverters 90 through 97, and transfer gates 98 and 99, as may be seen in the equivalent circuit diagram shown in FIG. 12B. In the present invention, the flip-flop is not limited to the D-type flip-flop as shown in FIG. 12B.

Figure 13:
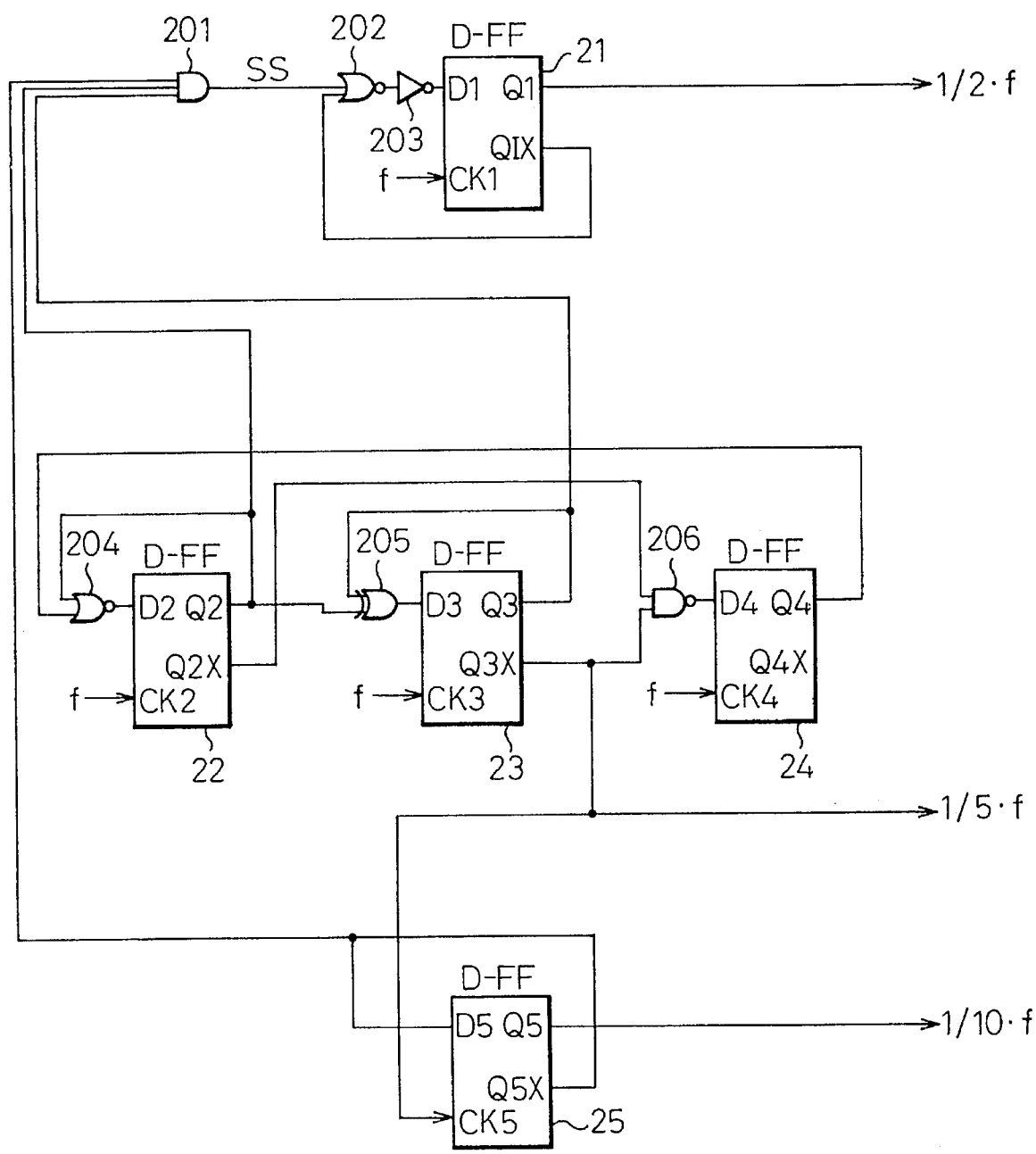
FIG. 13 is a circuit diagram of a synchronizing circuit according to a third embodiment of the present invention.
Figure 14:
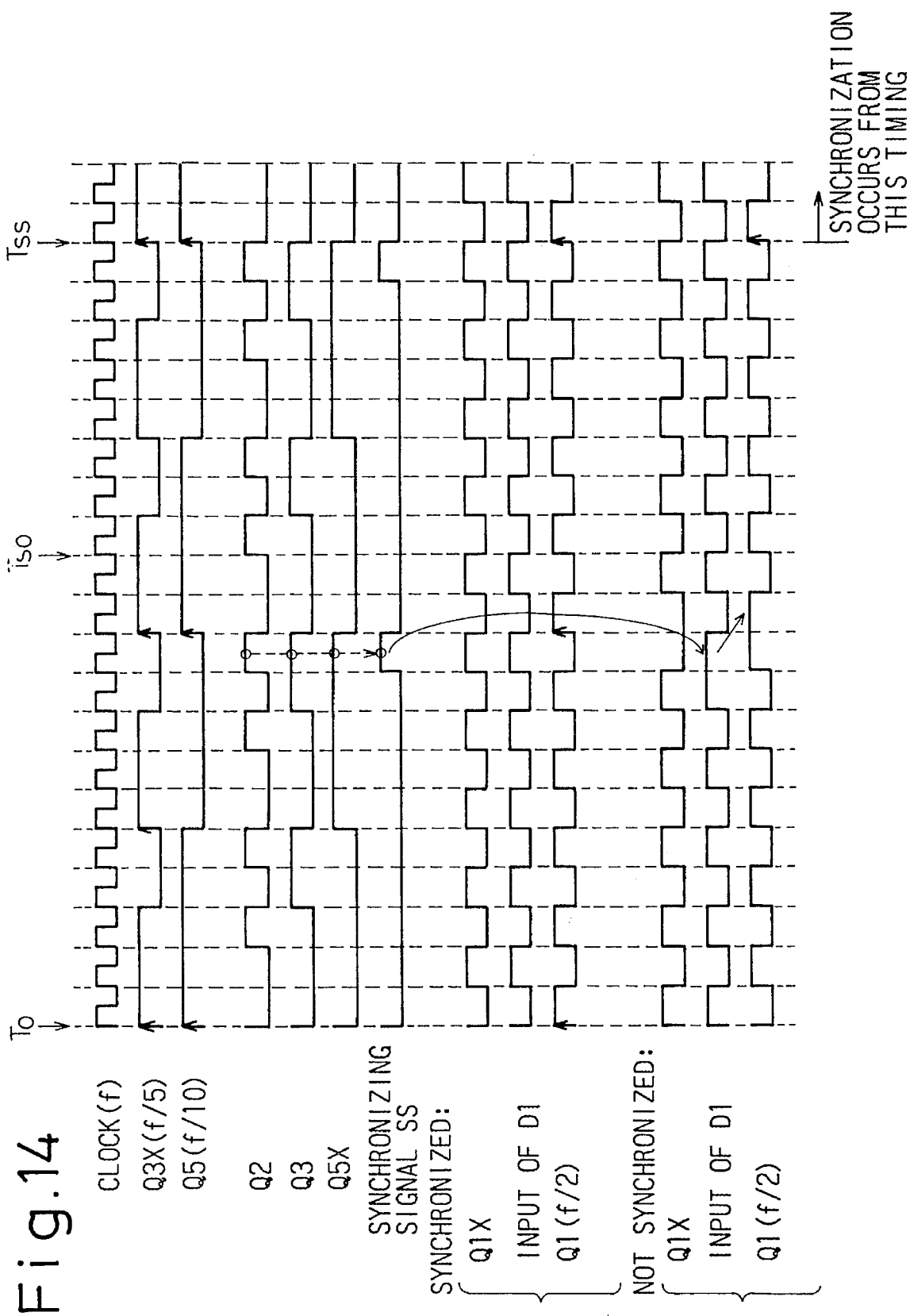
FIG. 14 is a timing chart of operations of the synchronizing circuit shown in FIG. 13.

FIGS. 13 and 14 show a fourth embodiment of the present invention, in which n=2. At n=2, the 1/(2n+1)f clock generating circuit 2 generates f/5 clock signals (internal clock signals), and the ½(2n+1)f clock generating circuit 3 generates f/10 clock signals, respectively.

As can be apparent from FIG. 13, the synchronizing circuit of the fourth embodiment comprises five D-type flip-flops (D-FF) 21 through 25, an AND gate 201, NOR gates 202 and 204, an inverter 203, an exclusive OR (EXOR) gate 205, and an NAND gate 206. The f/10 clock signal is obtained by dividing the f/5 clock signal by 2. The duty ratio of the f/5 clock signal is 3:2 by way of example (see FIG. 14).

The synchronizing signal generating circuit 4 comprises an AND gate 201 to whose input terminal are supplied with the outputs Q2 and Q3 of the flip-flops 22 and 23 and the inverted output Q5X of the flip-flop 25, so that the synchronizing signal SS can be obtained by a logical operation or (logical result of) these signals, as shown in FIG. 14. The synchronizing signal SS is supplied to the input terminal of the NOR gate 202, similarly to the first embodiment shown in FIG. 6.

In the fourth embodiment, the f/5 clock signal is fetched from the inverted output Q3X (inverted output terminal) of the flip-flop 23 and the f/10 clock signal is fetched from the output Q5 (output terminal) of the flip-flop 25, respectively.

Looking at FIG. 14, if the f/2 clock signal is synchronized with the f/5 clock signal and the f/10 clock signal at time To, the synchronization is maintained, regardless of the output level (level "H") of the synchronizing signal SS. Conversely, if the f/2 clock signal is not synchronized with the f/5 clock signal or f/10 clock signal, at time T0, the period of high level "H" at the data input terminal D1 of the flip-flop 21 is extended by one cycle of the clock signal f, in accordance with the synchronizing signal SS of high level "H", so that at time Tso, the output Q1 (f/2 clock signal) of the flip-flop 21 is synchronized with the inverted output Q3X (f/5 clock signal) of the flip-flop 23 and the output Q5 (f/10 clock signal) of the flip-flop 25. Note that the synchronization of the clock signals f/2, f/5 and f/10 occurs after time Tss due to the difference in period of the signals.

Figure 15:
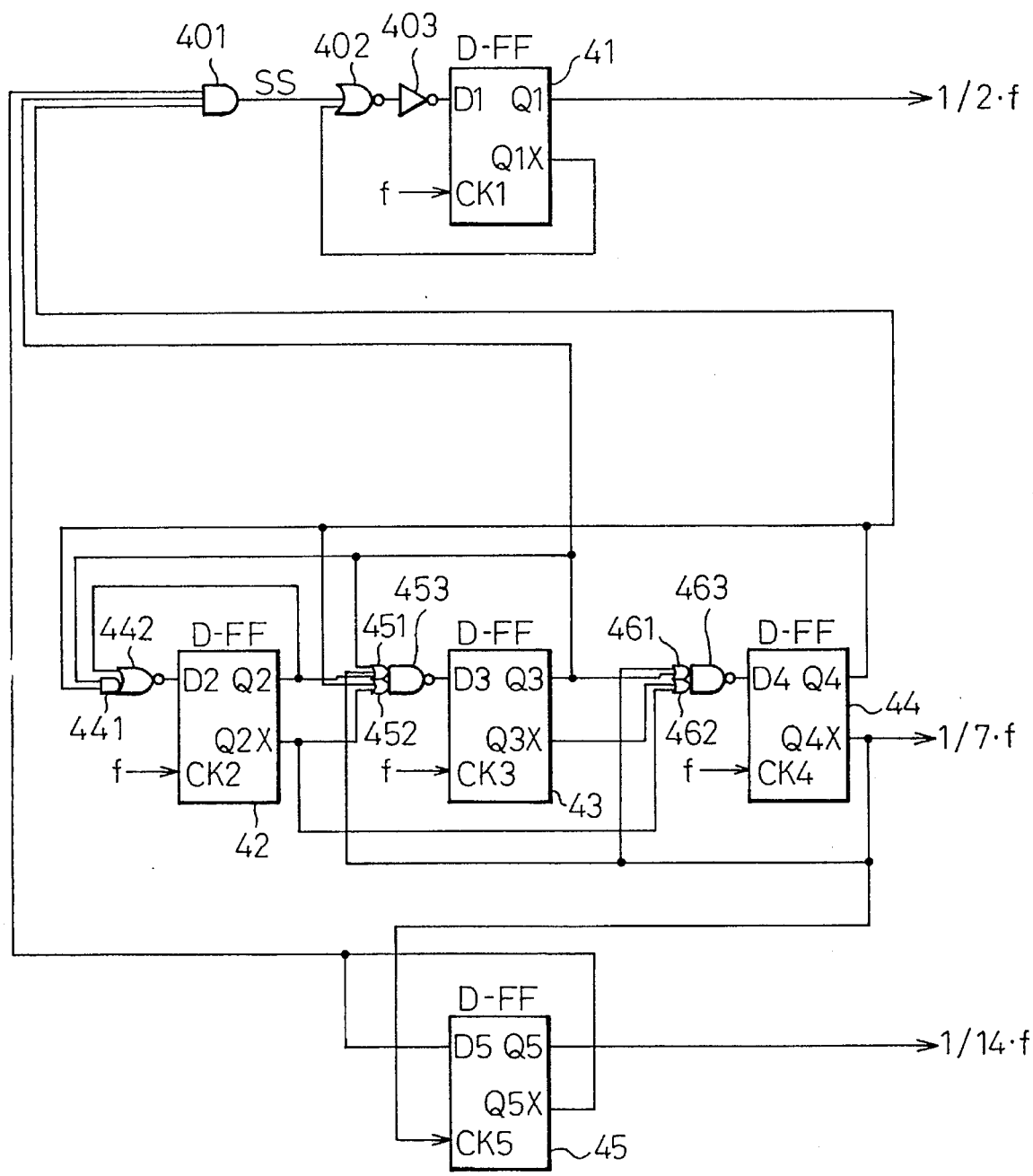
FIG. 15 is a circuit diagram of a synchronizing circuit according to a fifth embodiment of the present invention.
Figure 16:
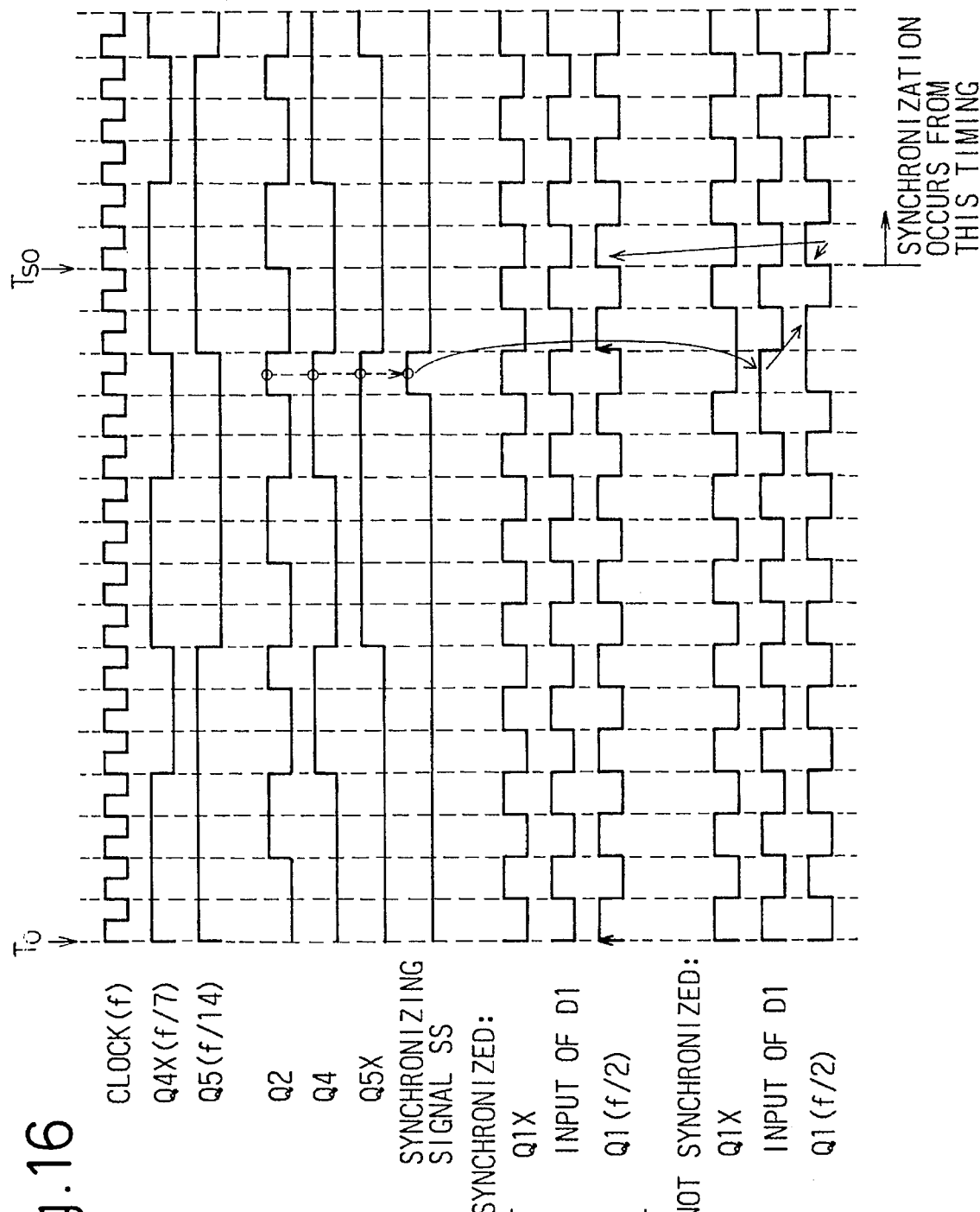
FIG. 16 is a timing chart of operations of the synchronizing circuit shown in FIG. 15.

FIGS. 15 and 16 show a fifth embodiment of the present invention, in which n=3. At n=3, the 1/(2n+1)f clock generating circuit 2 generates f/7 clock signals (internal clock signals), and the ½(2n+1)f clock generating circuit 3 generates f/14 clock signals, respectively.

As can be seen in FIG. 15, the synchronizing circuit of the fifth embodiment comprises five D-type flip-flops (D-FF) 41 through 45, AND gates 401 and 441, NOR gates 402 and 442, an inverter 403, OR gates 451, 452, 461 and 462, and NAND gates 453, and 463. The f/14 clock signal is obtained by dividing the f/7 clock signal by 2. The duty ratio of the f/7 clock signal is, for example, 4:3 (see FIG. 16). Note that even if the duty ratio of the f/7 clock signal is 4:3, there is no problem so long as the rising portions of the wave-shape signals are synchronized.

The synchronizing signal generating circuit 4 comprises an AND gate 401 to whose input terminals are supplied outputs Q3 and Q4 of the flip-flops 43 and 44 and the inverted output Q5X of the flip-flop 45, so that the synchronizing signal SS can be obtained by a logical operation on these signals, as shown in FIG. 16. The synchronizing signal SS is supplied to the input terminal of the NOR gate 402.

In the fifth embodiment, the f/7 clock signal is obtained from the inverted output (output terminal) Q4 of the flip-flop 44, and the f/14 clock signal is obtained from the output (output terminal) Q5 of the flip-flop 45.

Looking at FIG. 16, if the f/2 clock signal is synchronized with the f/7 clock signal and the f/14 clock signal at time To, the synchronization is maintained, regardless of the output level (level "H") of the synchronizing signal SS. Conversely, if the f/2 clock signal is not synchronized with the f/7 clock signal or f/14 clock signal, at time T0, the period of high level "H" at the data input terminal D1 of the flip-flop 41 is extended by one cycle of the clock signal f, in accordance with the synchronizing signal SS of high level "H", so that at time Tso, the output Q1 (f/2 clock signal) of the flip-flop 41 is synchronized with the inverted output Q4X (f/7 clock signal) of the flip-flop 45 and the output Q5 (f/14 clock signal) of the flip-flop 45. Note that in practice, the coincidence of the rise times of the clock signals (f/2, f/7 and f/14) occur after time Tso due to the difference in period of the signals, as in the above-mentioned embodiments.

Figure 17:
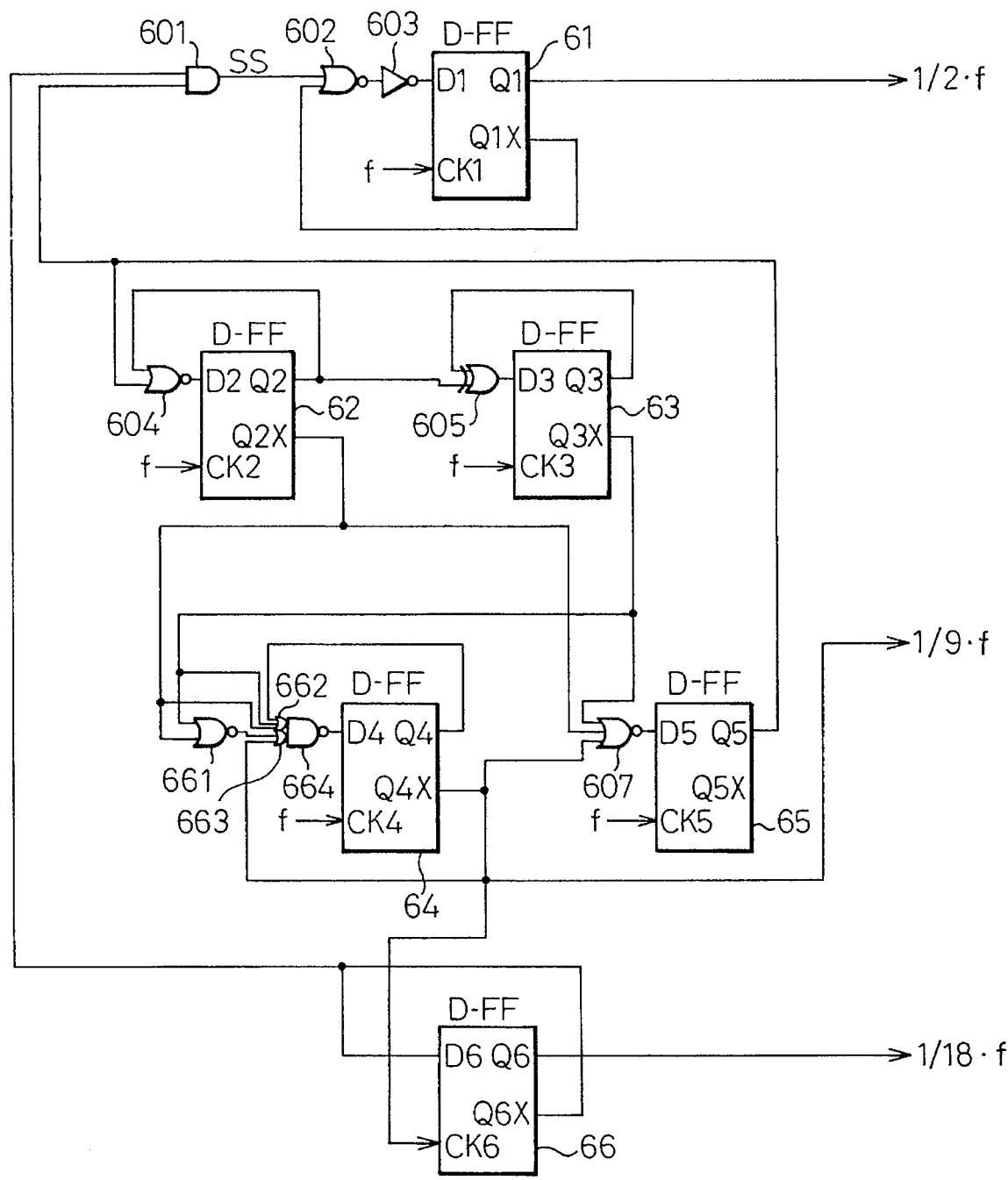
FIG. 17 is a circuit diagram of a synchronizing circuit according to a sixth embodiment of the present invention.
Figure 18:
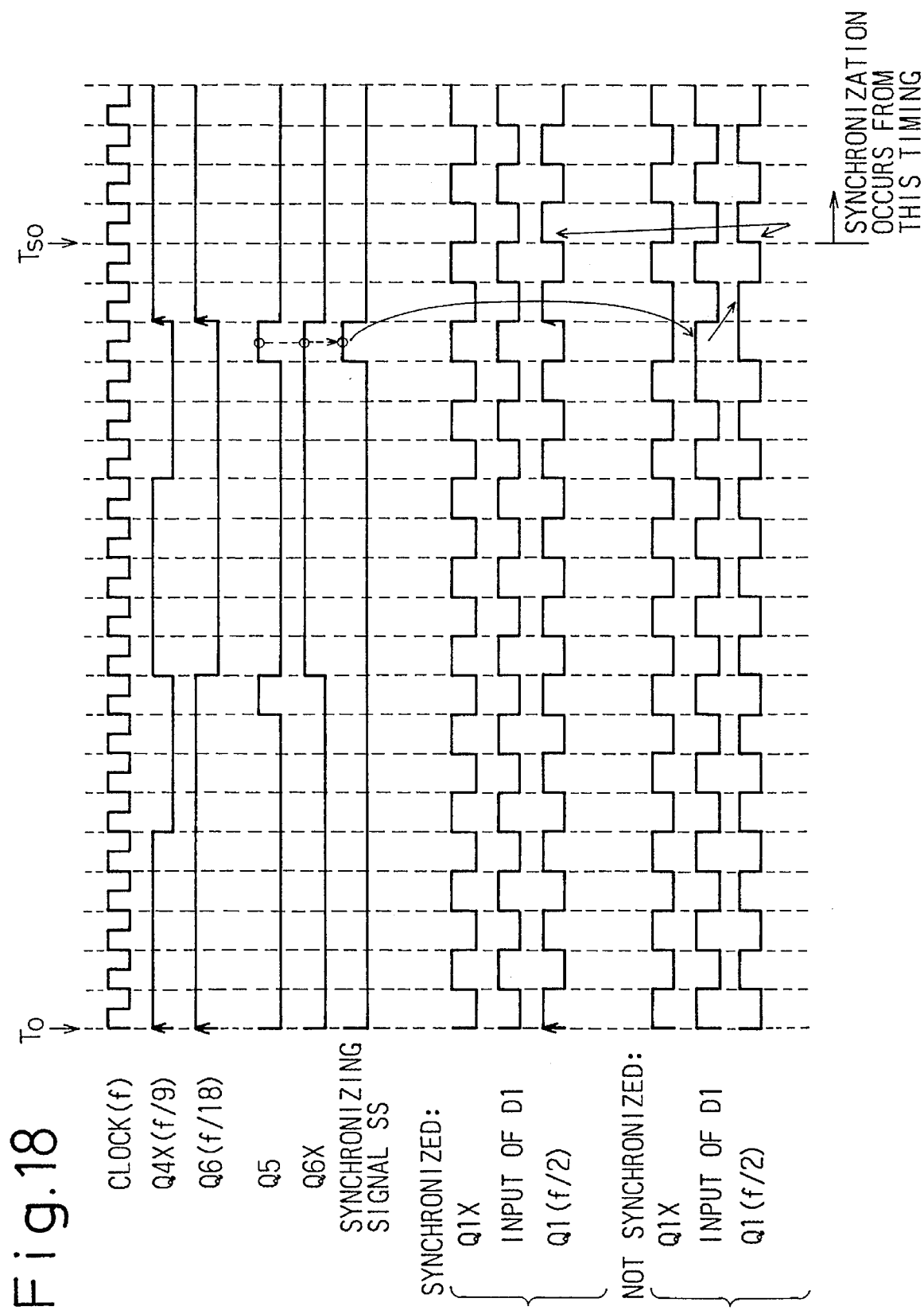
FIG. 18 is a timing chart of operations of the synchronizing circuit shown in FIG. 17.

FIGS. 17 and 18 show a sixth embodiment of the present invention, in which n=4. At n=4, the 1/(2n+1)f clock generating circuit 2 generates f/9 clock signals (internal clock signals), and the ½(2n+1)f clock generating circuit 3 generates f/18 clock signals, respectively.

As can be seen in FIG. 17, the synchronizing circuit of the sixth embodiment comprises six D-type flip-flops (D-FF) 61 through 66, an AND gate 601, NOR gates 602, 604, 661 and 607, an inverter 603, OR gates 662, 663, 461, and 462, a NAND gate 664, and an exclusive OR (EXOR) gate 605. The f/18 clock signal is obtained by dividing the f/9 clock signal by 2. The duty ratio of the f/9 clock signal is, for example, 5:4 (see FIG. 18). Note that even if the duty ratio of the f/9 clock signal is 5:4, there is no problem so long as the rising portions of the wave-shape signals are synchronized.

The synchronizing signal generating circuit 4 comprises an AND gate 601 to whose input terminals are supplied the output Q5 and the inverted output Q6X of the flip-flops 65 and 66, so that the synchronizing signal SS can be obtained by a logical operation on these signals, as shown in FIG. 18. The synchronizing signal SS is supplied to the input terminal of the NOR gate 602.

In the sixth embodiment, the f/9 clock signal is fetched from the inverted output (output terminal) Q4X of the flip-flop 64, and the f/18 clock signal is fetched from the output (output terminal) Q6 of the flip-flop 66, respectively.

Looking at FIG. 18, if the f/2 clock signal is synchronized with the f/9 clock signal and the f/18 clock signal at time To, the synchronization is maintained, regardless of the output level (level "H") of the synchronizing signal SS. Conversely, if the f/2 clock signal is not synchronized with the f/9 clock signal or f/18 clock signal, at time T0, the period of high level "H" at the data input terminal D1 of the flip-flop 41 is extended by one cycle of the clock signal f, in accordance with the synchronizing signal SS of high level "H", so that at time Tso, the output Q1 (f/2 clock signal) of the flip-flop 61 is synchronized with the inverted output Q4X (f/9 clock signal) of the flip-flop 64 and the output Q6 (f/18 clock signal) of the flip-flop 66. Note that the coincidence of the rise times of the clock signals (f/2, f/9 and f/18), in practice, occur after time Tso due to the difference in period of the signals, as in the above-mentioned embodiments.

As can be understood from the above discussion, even if the f/2 clock signal, the 1/(2n+1)f clock signal and the ½(2n+1)f clock signal (n=optional natural numbers) are not synchronized, i.e., even if the rise times of these clock signals are not identical, the clock signals can be synchronized at a later time. Moreover, the invention can be equally adapted to synchronize, for example, a ¼f or ⅛f clock signal with 1/(2n+1)f signal and ½(2n+1)f clock signal.

Figure 19:
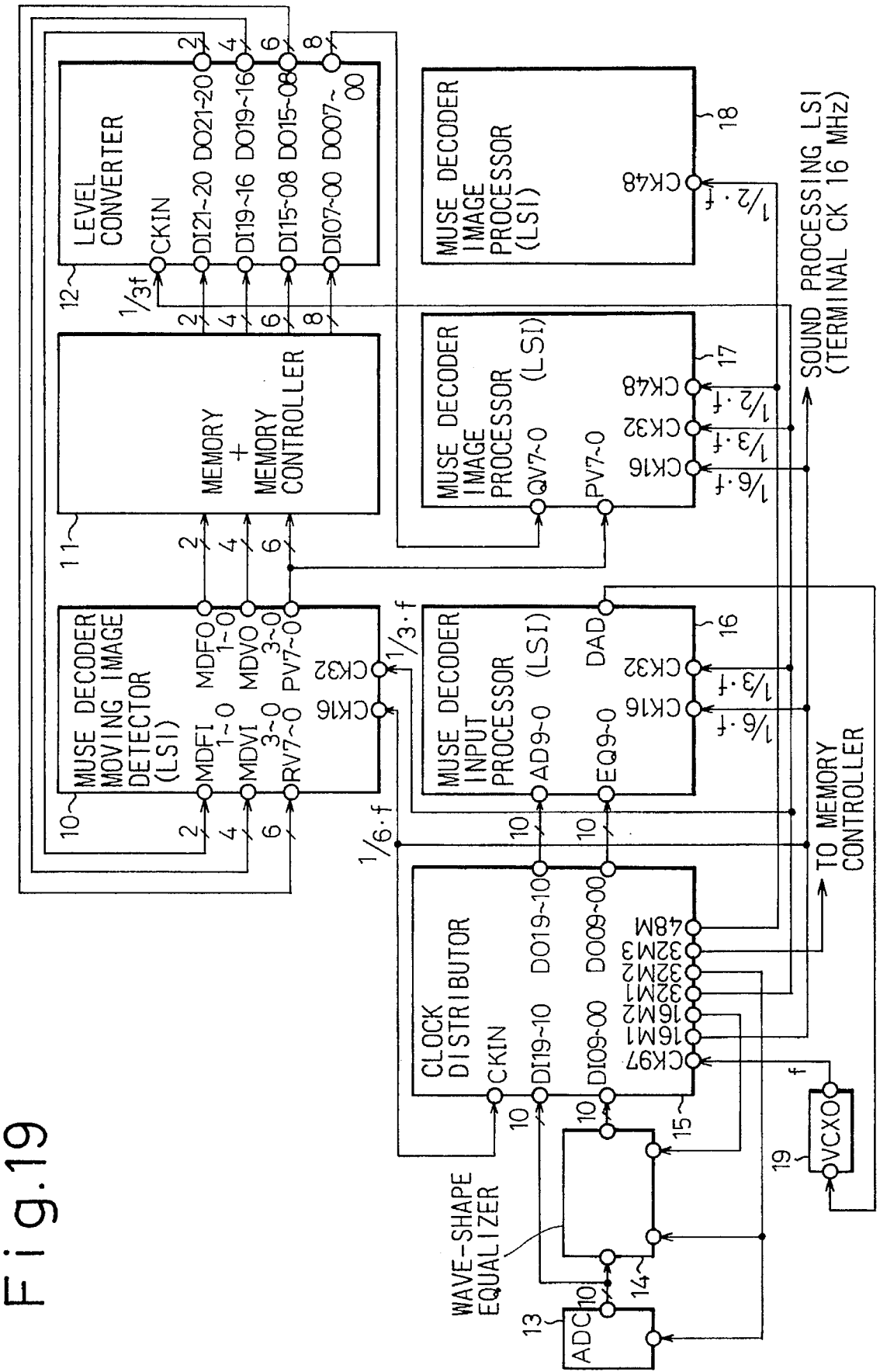
FIG. 19 is a block diagram of an apparatus to which a synchronizing circuit according to the present invention is applied.

FIG. 19 shows a schematic diagram of a decoder (MUSE decoder) in a high definition TV system to which the present invention is applied.

In FIG. 19, the MUSE decoder comprises a moving image detector 10, a memory plus memory controller 11, a level converter 12, an A/D converter 13, a wave shape equalizer 14, a clock distributor 15, an input processor 16, two image processors 17 and 18, and an oscillator (VCXO: Voltage Controlled X-tal Oscillator) 19. The synchronizing circuit of the present invention corresponds to the clock distributor 15, and receives the clock signals f sent from the oscillator 19 at the clock terminal CK97 to divide the clock signals to obtain three kinds of f/2, f/3 and f/6 internal clock signals that are output from the clock terminals 48M, 32M1 and 16M1.

The f/2 clock signal output from the clock distributor 15 is supplied to the MUSE decoder image processors 17 and 18; the f/3 clock signal is supplied to the moving image detector 10, the level converter 12, the input processor 16, and the image processor 17. Moreover, the f/6 clock signal output from the clock distributor 15 is supplied to the moving image detector 10, the input processor 16, and the image processor 17. The clock distributor 15 is incorporated in a same integrated circuit (LSI) together with the level converter 12 which converts a level of, for example, a 3-volt circuit to a 5-volt circuit.

The application of the synchronizing circuit of the present invention to the clock distributor 15 of the MUSE decoder makes it possible to provide synchronized internal clock signals including three kinds, f/2, f/3 and f/6, clock signals that can be obtained by dividing the clock signal f without using a reset signal. Hence, according to the present invention, neither wiring for the reset signal within the semiconductor integrated circuit (IC:LSI), nor wiring for a reset signal for the IC mounted on a substrate are necessary.

In addition to the foregoing, according to the present invention, the reset signal generating circuit can be dispensed with. It goes without saying that the synchronizing circuit according to the present invention can be applied not only to a clock distributor of a MUSE decoder, but also to various other circuitries.

As can be understood from the above discussion, according to the present invention, synchronized internal clock signals can be obtained without using a reset signal. Consequently, neither wiring for supplying the reset signal nor a reset signal generating circuit for generating a reset signal are needed.

Many different embodiments of the present invention may be constructed without departing from the spirit and scope of the present invention, and it should be understood that the present invention is not limited to the specific embodiments described in this specification, except as defined in the appended claims.

What is claimed is:

1. A synchronizing circuit comprising:
    a first signal generating means for dividing a control signal to obtain a first signal having a first frequency;
    a second signal generating means for dividing the control signal to obtain a second signal having a second frequency;
    a third signal generating means for dividing the control signal to obtain a third signal having a third frequency and synchronized with the second signal; and
    a synchronizing signal generating means for generating a synchronizing signal synchronizing the first signal with the second and third signals in accordance with a logical result of the first, second and third signals wherein the first, second and third signals are internal clock signals having different frequencies.

2. A synchronizing circuit as claimed in claim 1, wherein the control signal is an externally supplied clock signal.

3. A synchronizing circuit as claimed in claim 1, wherein said first signal generating means generates the first signal whose frequency is one-half the frequency of the control signal; said second signal generating means generates the second signal whose frequency is one-third the frequency of the control signal; and said third signal generating means generates the third signal whose frequency is one sixth the frequency of the control signal, respectively.

4. A synchronizing circuit as claimed in claim 3, wherein said third signal generating circuit divides the second signal generated by said second signal generating means by two to obtain the third signal whose frequency is one-half the frequency of the second signal.

5. A synchronizing circuit as claimed in claim 1, wherein said first, second and third signal generating means comprise D-type flip-flops.

6. A synchronizing circuit as claimed in claim 5, wherein said first signal generating means comprises a first D-type flip-flop which receives and divides the control signal by two; said second signal generating means comprises second and third D-type flip-flops which receive and divide the control signal by three; and said third signal generating means comprises a fourth D-type flip-flop which divides the output of the second signal generating means.

7. A synchronizing circuit as claimed in claim 5, wherein said first signal generating means comprises a first D-type flip-flop which receives and divides the control signal by two; said second signal generating means comprises second and third D-type flip-flops which receive and divide the control signal by three; and said third signal generating means comprises a fourth D-type flip-flop which divides the control signal by three in response to an output of said second D-type flip-flop and a fifth D-type flip-flop which divides an output of said fourth D-type flip-flop in response to the control signal.

8. A synchronizing circuit as claimed in claim 1, wherein said synchronizing signal generating means generates the synchronizing signal in accordance with a logical result of an output of said second signal generating means and an output of said third signal generating means.

9. A synchronizing circuit as claimed in claim 8, wherein said synchronizing signal generating means comprises an AND gate, so that the synchronizing signal is obtained by a logical result of the output of said second signal generating means and the output of said third signal generating means.

10. A synchronizing circuit as claimed in claim 9, wherein said first signal generating means generates the first signal in accordance with a logical result of the synchronizing signal generated by said synchronizing signal generating means and an output of said first signal generating means.

11. A synchronizing circuit as claimed in claim 8, wherein said synchronizing signal generating means comprises a first selecting circuit.

12. A synchronizing circuit as claimed in claim 11, wherein said first selecting circuit selects the output of the second signal generating means or an output of a first power source means to generate the synchronizing signal in accordance with the output of said third signal generating means.

13. A synchronizing circuit as claimed in claim 12, wherein the synchronizing signal as the output of said first selecting circuit is supplied to a second selecting circuit, so that said first signal generating means generates the first signal in accordance with the output of said first signal generating means or the output of a second power source, selected by said second selecting circuit in accordance with the synchronizing signal.

14. A synchronizing circuit as claimed in claim 13, wherein said first and second selecting circuits comprise inverters and transfer gates.

15. A synchronizing circuit as claimed in claim 1, wherein the first, second and third signals are synchronized at the rise time of a wave-shape pulse.

16. A synchronizing circuit as claimed in claim 1, wherein said synchronizing circuit is applied to a clock distributor of a decoder in a high definition television system.

17. A synchronizing circuit as claimed in claim 16, wherein said synchronizing circuit is applied to a clock distributor of a multiple sub-Nyquist sample encoding decoder.

18. A synchronizing circuit comprising:
    a first signal generating circuit for dividing a control signal to obtain a first signal having a first frequency;
    a second signal generating circuit for dividing the control signal to obtain a second signal having a second frequency;
    a third signal generating circuit for dividing the control signal to obtain a third signal having a third frequency and synchronized with the second signal; and
    a synchronizing signal generating circuit for generating a synchronizing signal synchronizing the first signal with the second and third signals in accordance with a logical result of the first, second and third signals wherein the first, second and third signals are internal clock signals having different frequencies.

* * * * *